US012653013B2

(12) United States Patent
Surthi et al.

(10) Patent No.: US 12,653,013 B2
(45) Date of Patent: Jun. 9, 2026

(54) ADVANCED INTERCONNECTION FOR WAFER ON WAFER PACKAGING

(71) Applicant: Micron Technology, Inc., Boise, ID (US)

(72) Inventors: Shyam Surthi, Boise, ID (US); Onorato Di Cola, Barete (IT)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 18/383,902

(22) Filed: Oct. 26, 2023

(65) Prior Publication Data

US 2024/0170426 A1  May 23, 2024

Related U.S. Application Data

(60) Provisional application No. 63/427,824, filed on Nov. 23, 2022.

(51) Int. Cl.
| | |
|---|---|
| *H10W 20/20* | (2026.01) |
| *H10B 80/00* | (2023.01) |
| *H10W 20/00* | (2026.01) |
| *H10W 20/42* | (2026.01) |
| *H10W 80/00* | (2026.01) |
| *H10W 90/00* | (2026.01) |

(52) U.S. Cl.
CPC ............ *H10W 20/20* (2026.01); *H10B 80/00* (2023.02); *H10W 20/023* (2026.01); *H10W*

*20/42* (2026.01); *H10W 80/312* (2026.01); *H10W 80/327* (2026.01); *H10W 90/792* (2026.01)

(58) Field of Classification Search
CPC ........ H10B 43/27; H10B 43/40; H10B 80/00; H10W 20/023; H10W 20/20; H10W 20/42; H10W 80/312; H10W 80/327; H10W 90/792
See application file for complete search history.

(56) References Cited

U.S. PATENT DOCUMENTS

2022/0336388 A1*  10/2022  Yang ................... H01L 23/5286

* cited by examiner

*Primary Examiner* — Britt Hanley
*Assistant Examiner* — Kevin Quinto
(74) *Attorney, Agent, or Firm* — Dorsey & Whitney LLP

(57) ABSTRACT

A semiconductor device assembly including a first module having one or more memory arrays, each of the one or more memory arrays being connected to a plurality of landing pads of the first module; and a second module having complementary metal-oxide-semiconductor devices, the second module including a plurality of socket shallow trench isolation (STI) regions disposed in a substrate of the second module, a plurality of metal routing layers connected to corresponding CMOS devices, a plurality of a first type of via contacts each being connected to a corresponding one of the plurality of metal routing layers, and a plurality of a second type of via contacts each being connected to a corresponding one of the plurality of landing pads of the first module, wherein the plurality of the first type of via contacts and the plurality of the second via contacts pass through the plurality of socket STI regions.

20 Claims, 15 Drawing Sheets

100a

Dielectric Layer 110

Landing Pad
106

Metal Layer
108

Bit Line 104

Memory Array
102

Deep
Contact
114

Substrate 112

100b

Dielectric Layer 128

Metal Routing
Layer 126

CMOS Device
122

Socket STI 124

Substrate 130

Socket
STI 124

CMOS
Device 122

Metal Routing
Layer 126

Dielectric
Layer 128

Bond Pad 138

Routing Layer 136

Socket STI 124

VIA Contact to
Memory Array 132

Metal Routing
Layer 126a

Landing Pad
106

Bit Line 104

Memory Array
102

Substrate 112

VIA Contact to
CMOS Device
134

Socket STI 124

Metal Routing
Layer 126b

Metal Layer 108

Deep
Contact
114

200b

Metal Routing
Layer 226

Dielectric Layer 228

CMOS
Device 222

Socket STI 224

Substrate 230

400

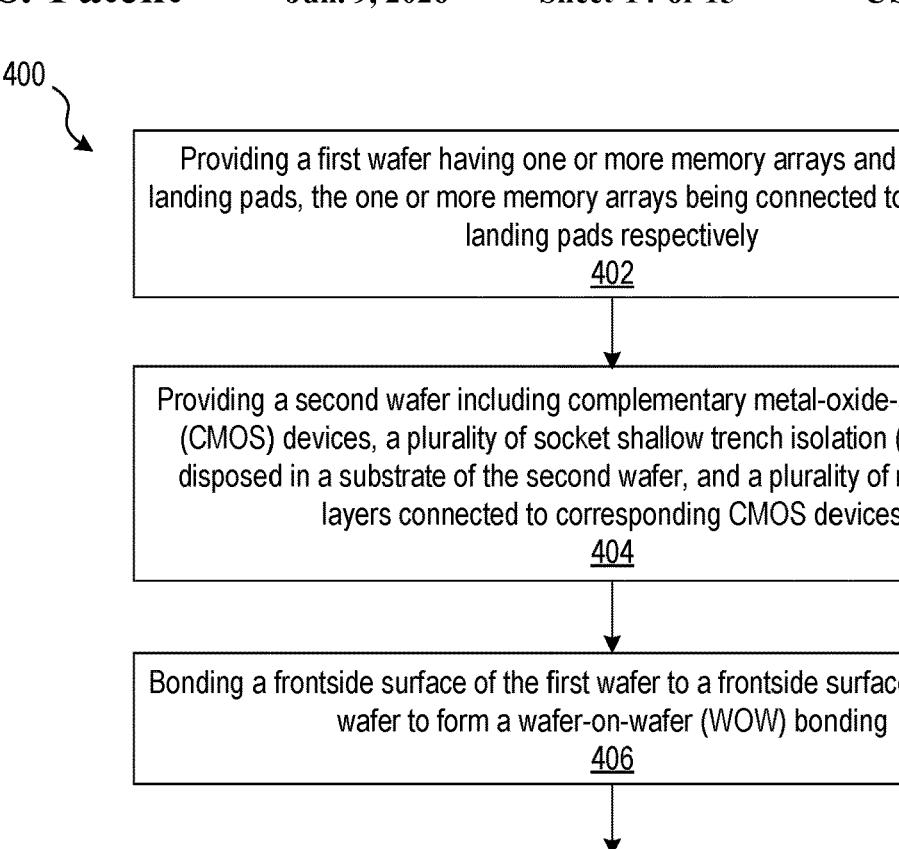

Providing a first wafer having one or more memory arrays and a plurality of landing pads, the one or more memory arrays being connected to the plurality of landing pads respectively
402

Providing a second wafer including complementary metal-oxide-semiconductor (CMOS) devices, a plurality of socket shallow trench isolation (STI) regions disposed in a substrate of the second wafer, and a plurality of metal routing layers connected to corresponding CMOS devices
404

Bonding a frontside surface of the first wafer to a frontside surface of the second wafer to form a wafer-on-wafer (WOW) bonding
406

Thinning the second wafer from its backside surface
408

Etching a plurality of a first type of via holes and a plurality of a second type of via holes from the backside surface of the second wafer, each of the plurality of the first type of via holes being etched to a corresponding one of the plurality of metal routing layers, and each of the plurality of the second type of via holes being etched to a corresponding one of the plurality of landing pads
410

Filling a conductive material into the plurality of the first type of via holes and the plurality of the second type of via holes to form a plurality of a first type of via contacts and a plurality of a second type of via contacts, respectively
412

Forming a plurality of routing layers each being connected to one of the plurality of the first type of via contacts and a corresponding one of the plurality of the second type of via contacts
414

ADVANCED INTERCONNECTION FOR WAFER ON WAFER PACKAGING

CROSS-REFERENCE TO RELATED APPLICATION(S)

The present application claims priority to U.S. Provisional Patent Application No. 63/427,824, filed Nov. 23, 2022, the disclosure of which is incorporated herein by reference in its entirety.

TECHNICAL FIELD

The present disclosure generally relates to wafer-on-wafer (WOW) packaging, and more particularly relates to advanced interconnection integrated in face-to-face (F2F) WOW packaging.

BACKGROUND

The processing of microelectronic devices such as NAND flash memory generally includes bonding a wafer, e.g., a complementary metal-oxide-semiconductor (CMOS) wafer, to a memory array wafer through a WOW bonding technique. The CMOS wafer and the memory array wafer can be further mounted on a package substrate or a carrier wafer and encased in a protective covering. The CMOS wafer may include integrated circuitry with a high density of small components including processor circuits, imager devices, string drivers, and/or high voltage (HV) circuits. On the other hand, the memory array wafer may include memory arrays including NAND flash memory arrays, dynamic random-access memory (DRAM) arrays, and/or phase change memory (PCM) arrays. Conventional processes to packaging the CMOS wafer and the memory array wafer include fabricating the memory array above the CMOS wafer to form a CMOS under Array (CuA) packaging scheme. In addition, the WOW packaging can be achieved by bonding frontside surfaces of the memory array wafer and CMOS wafer to form a pad over array (POA, front-to-front (F2F)) packaging or a pad over CMOS (POC, F2F) WOW packaging. Among these packaging schemes, the memory arrays and CMOS wafer modules can be interconnected through the metal-metal connections of a hybrid bonding interface for transitions of data signal and control signal.

BRIEF DESCRIPTION OF THE DRAWINGS

FIG. 4 is a flow chart illustrating a method of processing the F2F WOW packaging for semiconductor device assembly according to embodiments of the present technology.

Figure 1A:
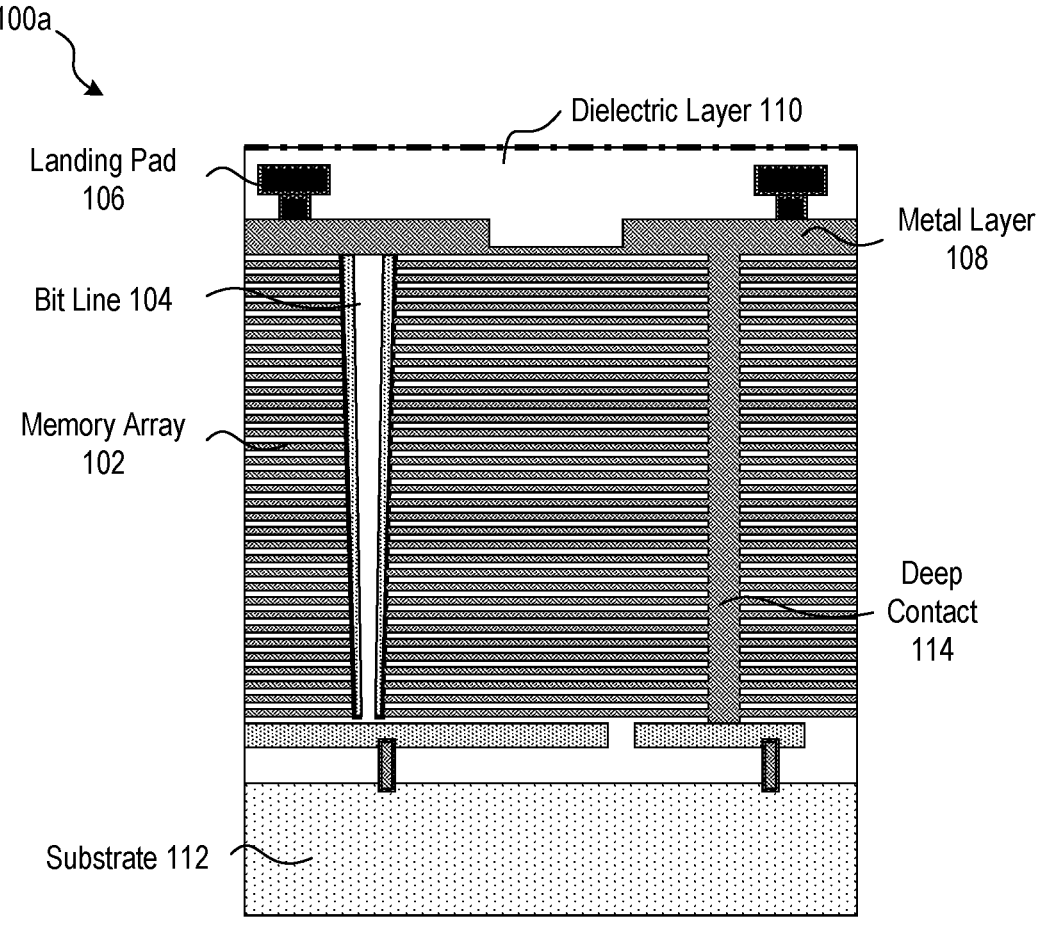
FIGS. 1A through 1G illustrate stages of a WOW packaging process for forming semiconductor device assemblies in accordance with embodiments of the present technology.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

In WOW packaging strategies, the fabrication of CMOS devices and memory arrays are generally separated. For example, CMOS devices can be processed in the CMOS wafer and memory arrays can be processed in a separate memory array wafer, without making any thermal constraints there between. With this configuration, the CMOS devices can be processed in a relative higher temperature compared to the memory array wafer to achieve better device performance. In addition, the CMOS wafer and memory array wafer can be bonded at some steps in the fabrication flow after each of their front-end-of-ling (FEOL) processes are completed.

Conventional F2F WOW bonding techniques such as POA F2F bonding and POC F2F bonding schemes utilize the hybrid bonding process to form dielectric-dielectric bonds and metal-metal bonds at the bonding interface. This hybrid bonding process is usually conducted with a post-bond anneal process at a high temperature, e.g., at 450° C. or higher, to achieve good fusion bonds at the metal-metal interface. The high post-bond anneal temperature introduces addition restrictions to the CMOS wafer and memory array wafer components and may degrade their performance. Another option for the WOW bonding of CMOS wafer and memory array wafer is to conduct a face-to-back (F2B) wafer bonding, i.e., bonding a backside surface of the CMOS wafer to a frontside surface of the memory array wafer through a direct dielectric-dielectric bonding at the interface. The F2B WOW direct bonding scheme can provide a high-quality bonding interface with a low thermal constraint. However, additional bonding procedures such as bonding the CMOS wafer to a substrate and wafer backside thinning process are also required for the F2B WOW direct bonding scheme, which make this process less attractive due to its high fabrication cost.

To address these challenges and others, the present technology applies a direct bonding technique to bond the frontside surfaces of the CMOS wafer and the memory array wafer, forming dielectric-dielectric bonds at the wafer interface with a low thermal constraint. This WOW bonding scheme places the CMOS wafer above the memory array wafer in order to improve the routing flexibility and power distribution in the CMOS wafer. In addition, this technology uses a double pad scheme, e.g., having landing pad disposed in both of the CMOS wafer and the memory array wafer for interconnections, and built-in socket dielectric regions in the CMOS wafer to allow interconnect contact passing there through to memory array at desired locations. Conventional semiconductor fabrication processes can be utilized to form the F2F WOW bonding scheme described in the present technology and the cost is comparable to other WOW bonding schemes using the hybrid bond technique. This technology also provides flexibility in designing metal routing layers on either the frontside or backside of the CMOS wafer in assisting the WOW bonding.

FIGS. 1A through 1G illustrate stages of a WOW packaging process for forming semiconductor device assemblies in accordance with embodiments of the present technology. In a first stage, a memory array wafer 100*a* is provided for the WOW packaging. As shown in FIG. 1A, the memory array wafer 100*a* may include a substrate 112, a memory array 102 disposed above the substrate 112, a plurality of bit lines 104 and deep contacts 114 vertically extending through the memory array 102, a plurality of metal layers 108 each connects to corresponding one of the bit lines 104 and deep contacts 114, and a plurality of landing pad 106. The memory array 102 may also include a plurality of word lines (not shown) each connected to corresponding one of the metal layers 108 for interconnections. In this example, each of the plurality of landing pads 106 is connected to corresponding one of the plurality of metal layers 108 for data and/or control signal transition to the memory array 102. The memory array wafer 100*a* is encapsulated by a dielectric layer 110, i.e., having the dielectric layer 110 disposed on its frontside surface.

In this example, the memory array 102 may include dynamic random-access memory (DRAM) memory arrays, NOT-AND (NAND) memory arrays, NOT-OR (NOR) memory arrays, magnetic random access memory (MRAM) memory arrays, phase change memory (PCM) memory arrays, ferroelectric random access memory (FeRAM) memory arrays, static random access memory (SRAM) memory arrays, or the like. Moreover, the dielectric layer 110 can be made of dielectric materials including tetraethyl orthosilicate (TEOS), silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN), a low-k dielectric material, or a combination thereof.

Figure 1B:
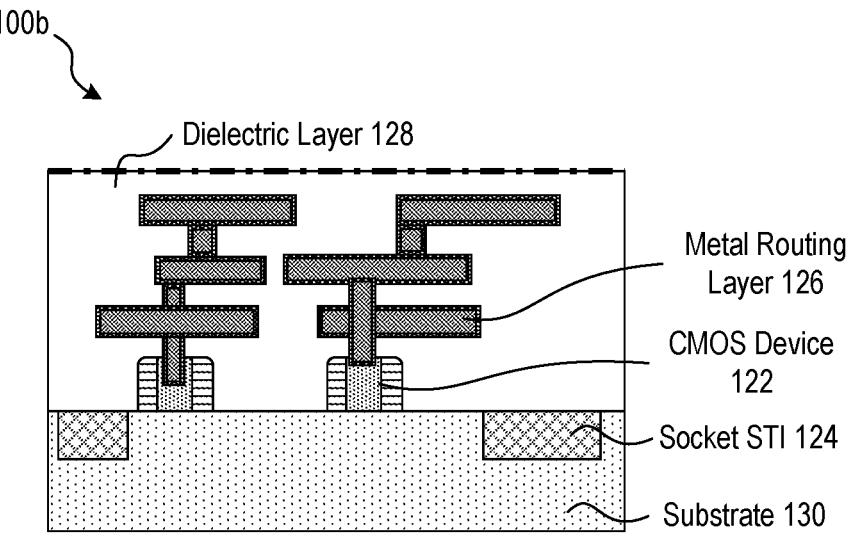

In a following stage, a CMOS wafer 100*b* can be provided to the WOW packaging process for WOW bonding. For example, and as shown in FIG. 1B, the CMOS wafer 100*b* may include a substrate 130, a plurality of CMOS devices 122 that are disposed above the substrate 130, a plurality of metal routing layers 126, and a plurality of socket shallow trench isolation (STI) regions 124. The plurality of socket STI regions 124 may have a thickness close to 2 μm and are disposed below a top surface of the substrate 130. In this example, the plurality of socket STI regions 124 can be processed during or after the fabrication of the plurality of CMOS devices 122. For example, the substrate 130 can be patterned in a lithography-etch process to form trenches on its top surface. The trenches can be filled by dielectric materials to form the plurality of socket STI regions 124. In some other embodiments, the plurality of STI regions 124 can be configured to perform as electrical isolation between neighboring CMOS devices 122.

In this example, the CMOS wafer 100*b* includes five levels of the metal routing layers 126 for each of the plurality of CMOS devices 122. Here, the five levels of metal routing layers 126 are configured to interconnect the corresponding CMOS device 122 to an outer circuit, e.g., memory array 102 of the memory array wafer 100*a*, in order to transfer voltage and/or control signals there between. The metal routing layers 126 can be made of electrically conductive materials, e.g., tungsten or copper. Additionally, plurality of CMOS devices 122 and the plurality of metal routing layers 126 are encapsulated by a dielectric layer 128, which is disposed at the frontside surface of the CMOS wafer 100*b*. Here, the dielectric layer 128 can be made of dielectric materials similar to that of the dielectric layer 110.

Figure 1C:
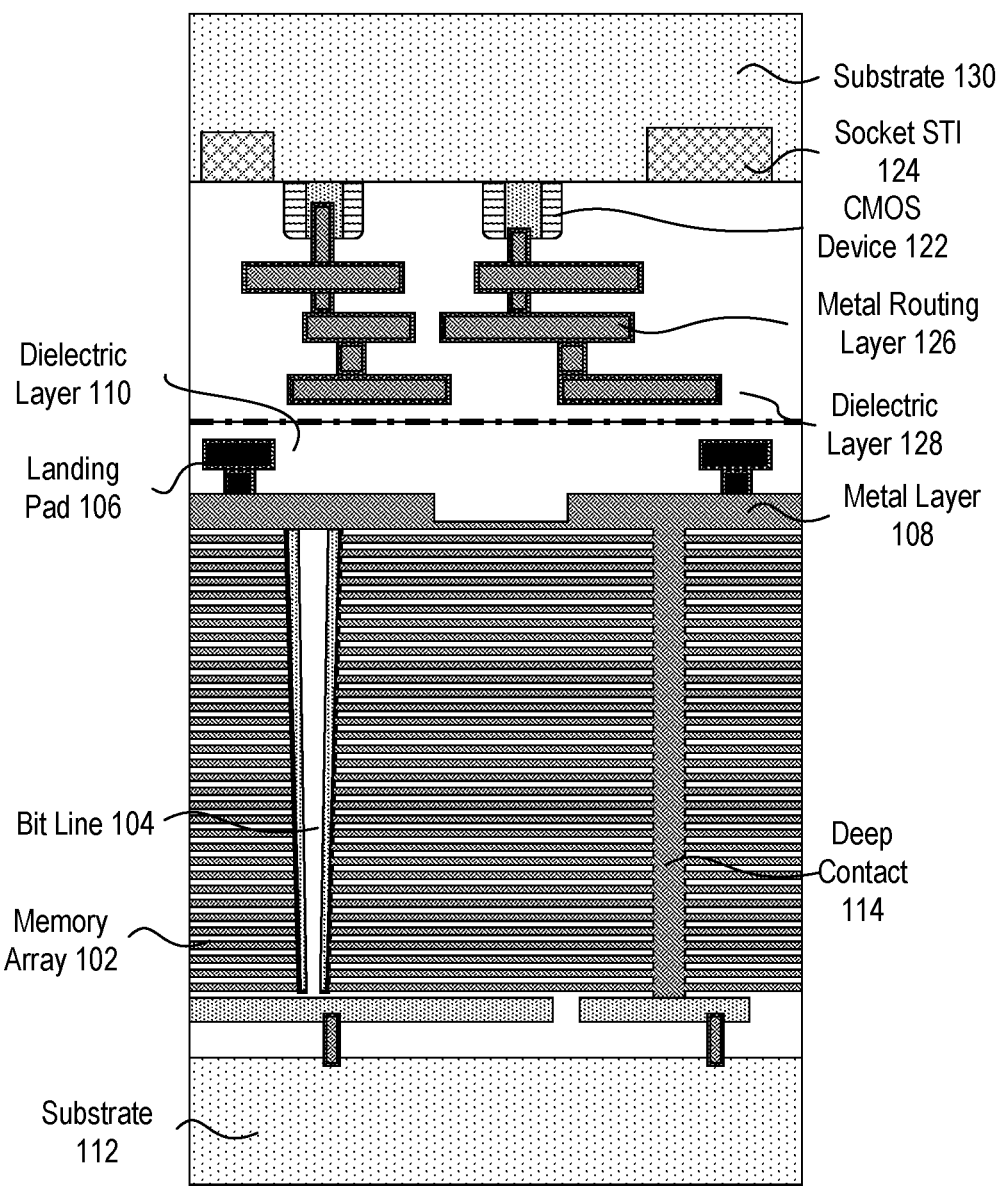

In a next stage, the CMOS wafer 100*b* can be bonded to the memory array wafer 100*a* to form the WOW bonding. As shown in FIG. 1C, the frontside surface of the CMOS wafer 100*b* is bonded to the frontside surface of the memory array wafer 100*a* through the direct bonding technique, e.g., a dielectric-dielectric fusion bonding with strong covalent bonds. In this example, the dielectric-dielectric bonds can be formed between the dielectric layers 110 and 128, and through applying heat or compressive pressures thereon. Specifically, the dielectric-dielectric bonds formed at the WOW bonding interface can be oxide-oxide covalent bonds. Further, in order to form vertical interconnections between the CMOS devices 122 and corresponding metal layers 108, at least one of the plurality of metal routing layers 126 is vertically aligned to the corresponding landing pad 106 for the interconnection. In this example, the landing pads 106 may be configured to be larger, e.g., larger than corresponding socket STI region 124, to improve the alignment of vertical interconnections. Here, a F2F WOW bonding is enabled by mounting the frontside surface of the CMOS wafer to the frontside surface of the memory array wafer. This F2F WOW bonding may only require a direct bonding process, e.g., an oxide-oxide fusion bonding at the WOW bonding interface.

Figure 1D:
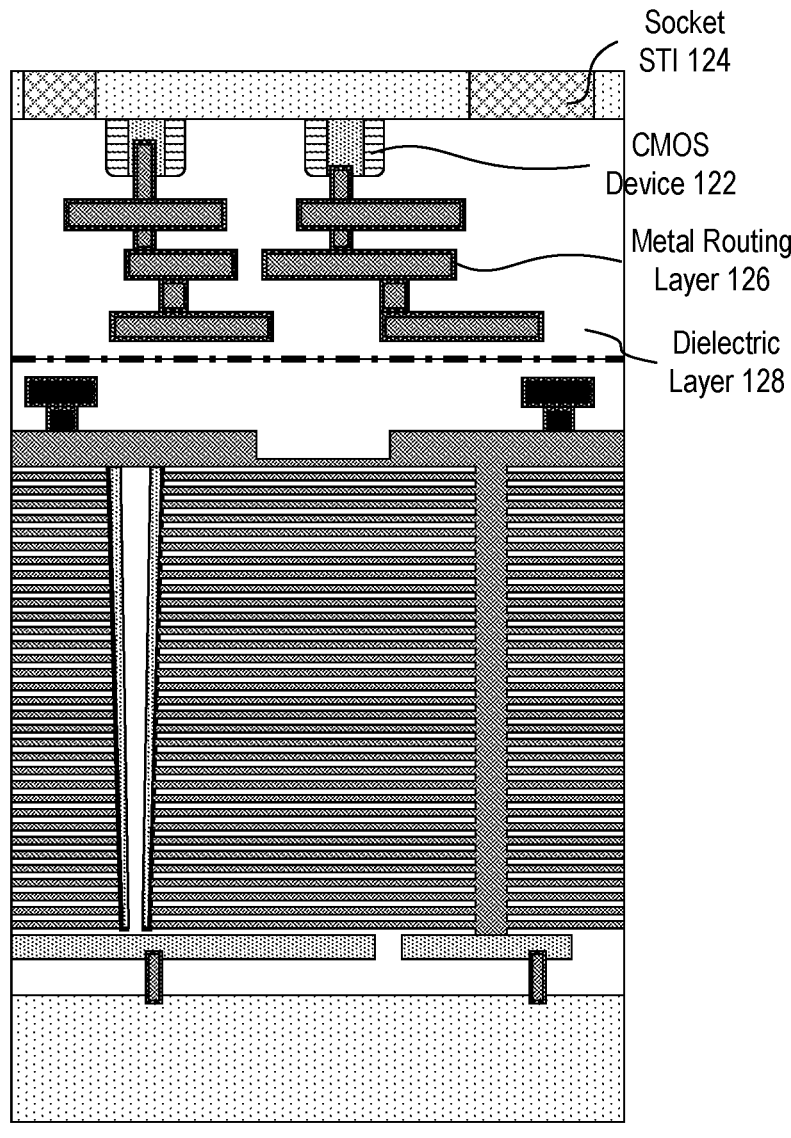

In a following stage, the CMOS wafer 100*b* of the WOW packaging can be thinned from its backside surface. As shown in FIG. 1D, once the WOW bonding process is completed, the backside surface of the substate 130 of the CMOS wafer 100*b* can be further thinned by a suitable technique such as wafer back grinding to remove the bulk of excess substrate/wafer thickness. In this example, the wafer thinning process may continue until the plurality of socket STI regions 124 are exposed on the backside surface of the thinned CMOS wafer 100*b*. In another example, the CMOS wafer 100*b* may be thinned to a thickness close to 2 μm. There may be a chemical mechanical polishing (CMP) process being conducted following the CMOS wafer 100*b* thinning process to further planarize its backside surface.

In this example, an edge trimming process may be conducted on the CMOS wafer 100*b* after the WOW bonding and the wafer thinning processes to prevent wafer edge chipping issues. Here, the edge trimming process could effectively remove the rounded shape on the outer edge of the CMOS wafer 100*b* which may cause wafer edge chipping, so as to prevent the CMOS wafer 100*b* from breaking.

Figure 1E:
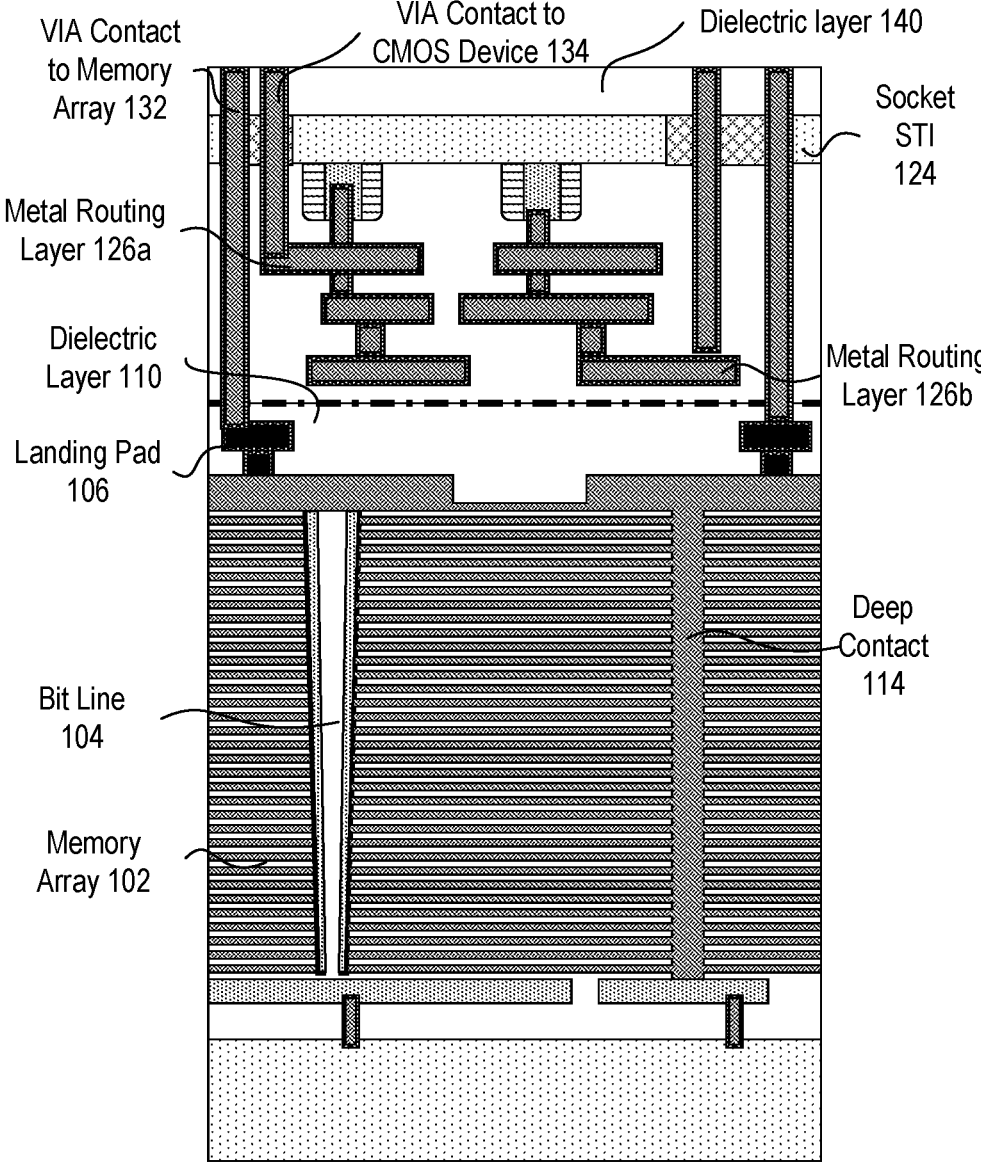

In a next stage, via interconnections can be formed in the F2F WOW packaging. As shown in FIG. 1E, a dielectric layer 140 can be formed on the backside surface of the thinned CMOS wafer 100*b*. The dielectric layer 140, e.g., a silicon oxide layer, can be deposited, for example, using chemical vapor deposition, physical vapor deposition, atomic layer deposition, plating, electroless plating, spin coating, and/or other suitable techniques. Sequentially, two types of via contacts can be formed in the WOW packaging. The first via contact is the via contact to memory array 132 that is disposed in the CMOS wafer 100*b* and further extends into the memory array wafer 100*a*. Specifically, the via contact to memory array 132 passes through corresponding socket STI region 124 and is connected to corresponding landing pad 106. The second via contact is the via contact to CMOS devices 134 which is disposed in the CMOS wafer 100*b* and passes through corresponding socket STI region 124. In some embodiments, the via contact to memory array 132 and the via contact to CMOS devices 134 may be paired for interconnection between each of the CMOS devices 122 and corresponding one of the landing pads 106.

In this example, the paired via contact to memory array 132 and via contact to CMOS devices 134, as shown on the top left of FIG. 1E, both pass through a same socket STI region 124 within which they are electrically isolated by the dielectric material of the socket STI region 124. Specifically, the via contact to CMOS device 134 is connected to a lower-level metal routing layer 126, e.g., a first level metal routing layer 126*a*. In some other examples, the via contact to CMOS device 134 can be connected to a higher-level metal routing layer 126, e.g., a fifth level metal routing layer 126*b*, as shown on the top right of FIG. 1E. Moreover, the paired via contact to memory array 132 and via contact to CMOS devices 134 can be configured to pass through different socket STI regions 124. For example, the via contact to memory array 132 may pass through a first socket STI region 124 and the via contact to CMOS devices 134 may pass through a second socket STI region 124 that is separated from the first socket STI region 124.

In this example, the via contact to memory array 132 and via contact to CMOS devices 134 can be processed by a single via etch process. For example, a patterned hard mask or photoresist layer can be formed above the backside surface of the thinned CMOS wafer 100*b*, exposing areas corresponding to the via contact to memory array 132 and the via contact to CMOS devices 134. Here, a directional etching technique, for example, a reaction ion etching (RIE) technique, a plasma etching technique, a wet etching technique, or other suitable techniques can be applied to etch of the exposed backside surface regions of the CMOS wafer 100*b* to form via holes. The etching process may continue until the via holes reach the corresponding metal routing layer 126 and landing pad 106, respectively. Following the etching process, the via holes can be filled with any appropriate conductive materials such as copper, tungsten, molybdenum, nickel, titanium, tantalum, platinum, silver, gold, ruthenium, iridium, rhenium, rhodium, or alloys thereof, to form via contacts. In this example, the socket STI regions 124 that have the via contact to CMOS device 134 passing through can be configured to be aligned to the corresponding metal routing layer 126. For example, the corresponding metal routing layer 126, during its processing, can be aligned with the corresponding socket STI region 124, to improve the alignment of via contact to CMOS device 134.

Figure 1F:
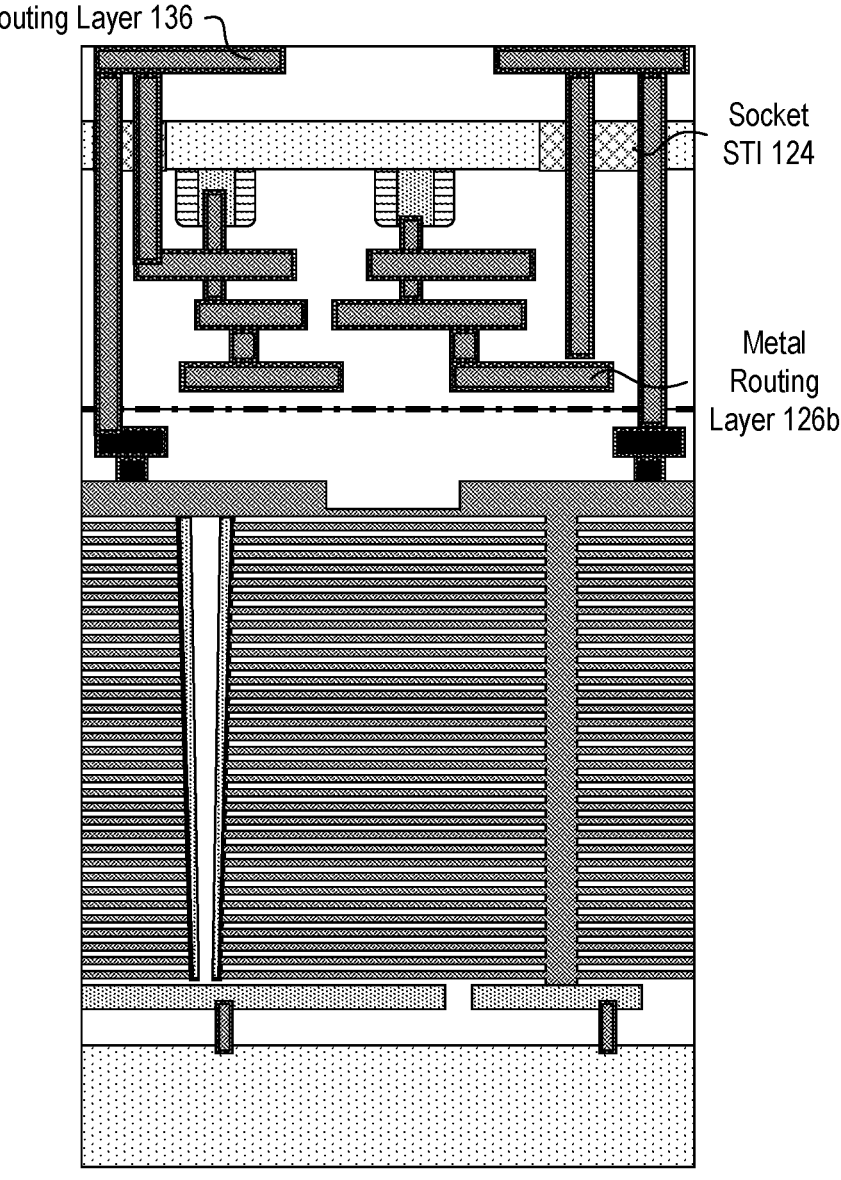

In a following stage, additional metal routing layers can be formed on the CMOS wafer 100*b* for interconnections. For example, as shown in FIG. 1F, the routing layers 136 can be patterned on the backside surface of the CMOS wafer 100*b*. Specifically, each of the routing layers 136 can be connected to corresponding paired via contact to memory array 132 and via contact to CMOS devices 134, to complete the interconnection between the metal routing layer 126 and corresponding landing pad 106. This way, electrical signal or voltages can be transferred between the CMOS devices 122 and corresponding portions (e.g., a bit line or a word line) of the memory array 102. In some embodiments, the routing layer 136 can be formed by etching the dielectric layer 140 of the CMOS wafer 100*b* and a portion of the via contact to memory array 132 and via contact to CMOS devices 134. In some other embodiments, the routing layer 136 can be deposited in a patterned additional dielectric layer that is formed above the dielectric layer 140, as shown in FIG. 1F.

Figure 1G:
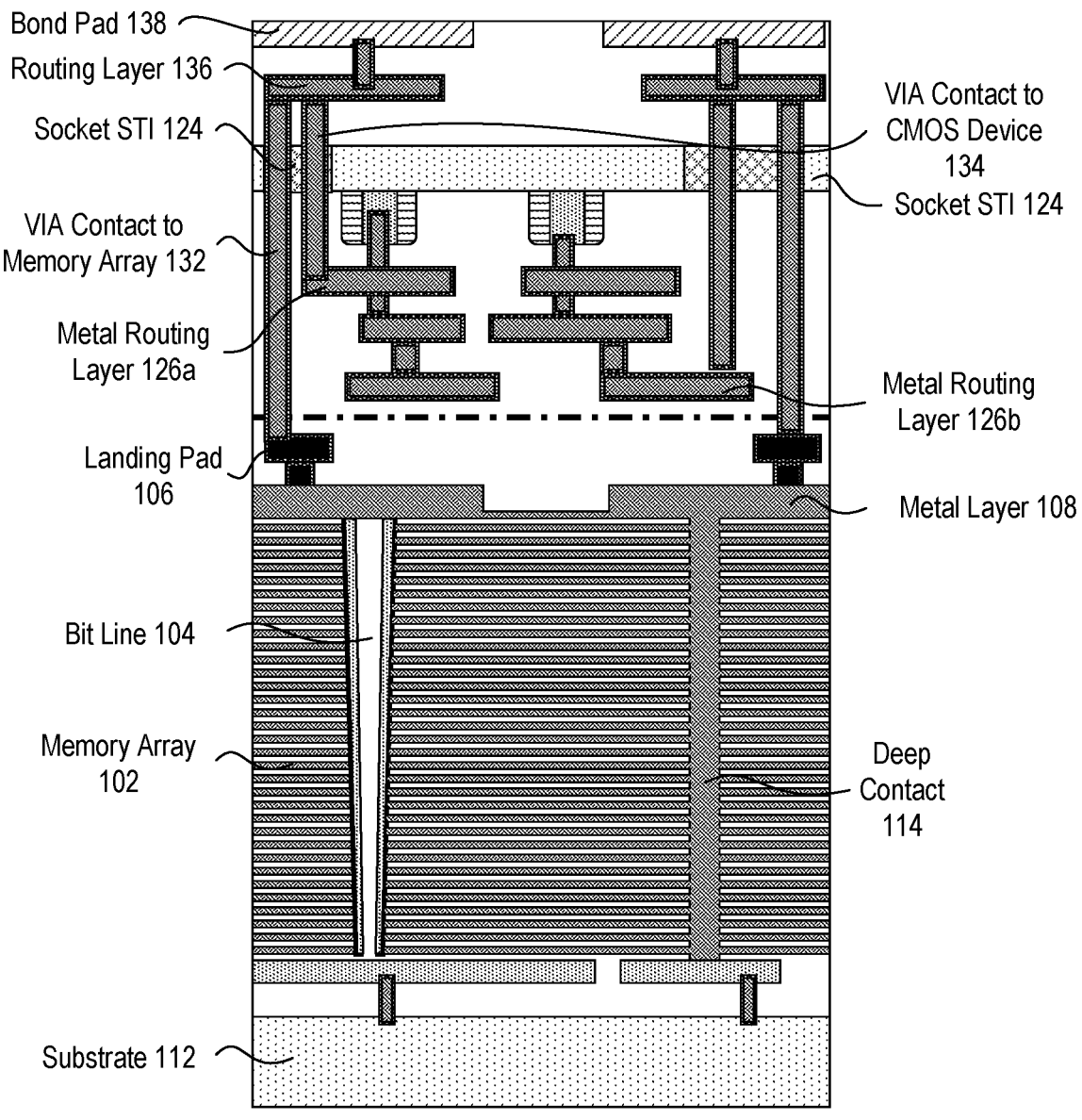

FIG. 1G illustrates the final WOW packaging structure after a last stage of the WOW bonding process. The final WOW packaging structure includes a plurality of bond pads

138 disposed on the backside surface of the CMOS wafer 100*b*. Each of the plurality of bond pads 138 is connected to corresponding one of the routing layers 136, to provide electrical connection between the WOW packaging to other integrated circuits (e.g., a logic circuit or a peripheral circuitry) that are operatively coupled to the memory array 102.

In the present technology, the CMOS wafer 100*b* is configured to be disposed above the memory array wafer 100*b* in the WOW packaging, allowing improved metal routing layer flexibility and power distribution therein, e.g., allowing signals routing at different level of metal routing layers. Moreover, the F2F WOW bonding strategy of the present technology enables a double pads scheme, having landing pads on both of the CMOS wafer 100*b* and the memory array wafer 100*a*. For example, as shown in FIG. 1G, the bond pads 138 are disposed on the backside surface of the CMOS wafer 100*b* and the landing pads 106 are disposed close to the frontside surface of the memory array wafer 100*a*. Further, the socket STI regions 124 are embedded in the substrate 130 of the CMOS wafer 100*b*, which allows via contacts to pass there through at desired locations.

The F2F WOW bonding scheme described above in FIGS. 1A through 1G utilizes standard semiconductor processes with a simplified process flow. It eliminates additional bonding procedures, e.g., attaching the CMOS wafer 100*b* to a carrier wafer in a face-to-back (F2B) WOW bonding scheme. In addition, this F2F WOW bonding scheme presents a good alignment of via contact to the CMOS device 122 through adjusting the alignment between the socket STI region 124 and corresponding metal routing layer 126. Moreover, the enlarged design of landing pad 106 of the memory array wafer 100*a* could help achieve a good alignment of the via contacts between the CMOS wafer 100*b* and the memory array wafer 100*a*. The bonded CMOS wafer 100*a* and memory array wafer 100*a* can be further singulated by a proper technique to form a plurality of semiconductor assemblies each having a CMOS module disposed/bonded above a memory module.

Figure 2A:
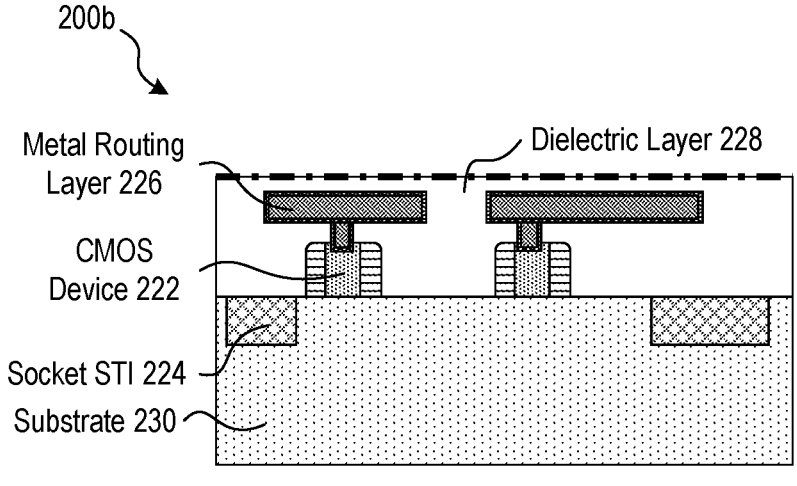
FIGS. 2A through 2D illustrate stages of another WOW packaging process for forming semiconductor device assemblies in accordance with embodiments of the present technology.

FIGS. 2A through 2D illustrate stages of another WOW packaging process for forming semiconductor device assemblies in accordance with embodiments of the present technology. In this example, CMOS wafer with limited levels of metal routing layers is provided to the WOW bonding processes. Moreover, additional levels of metal routing layers can be processed after forming a F2F WOW bonding. For example, FIG. 2A illustrates a CMOS wafer 200*b* that is incoming to the WOW bonding process. Specifically, the CMOS wafer 200*b* only includes a single level of metal routing layers 226 each being connected to a corresponding CMOS device 222. In addition, the CMOS wafer 200*b* includes a substrate 230, a plurality of socket STI regions 224 disposed below a top surface of the substrate 230, and a plurality of CMOS device 222 disposed above the substrate 230. The substrate 230, the CMOS device 222, as well as the metal routing layer 226 can be encapsulated by a dielectric layer 228. As shown, the dielectric layer 228 is disposed on a frontside surface of the CMOS wafer 200*b*. In this example, the socket STI 224 may have a thickness close to 2 μm. Similar to the socket STI regions 124, the socket STI regions 224 can be processed during or after the fabrication of the plurality of CMOS devices 222. For example, trenches can be processed on the frontside surface of the substrate 230 and dielectric material such as silicon oxide can be filled into the trenches to form the socket STI regions 224. A CMP process may be further conducted after the dielectric deposition to planarize the surface of the socket STI regions 224.

Figure 2B:
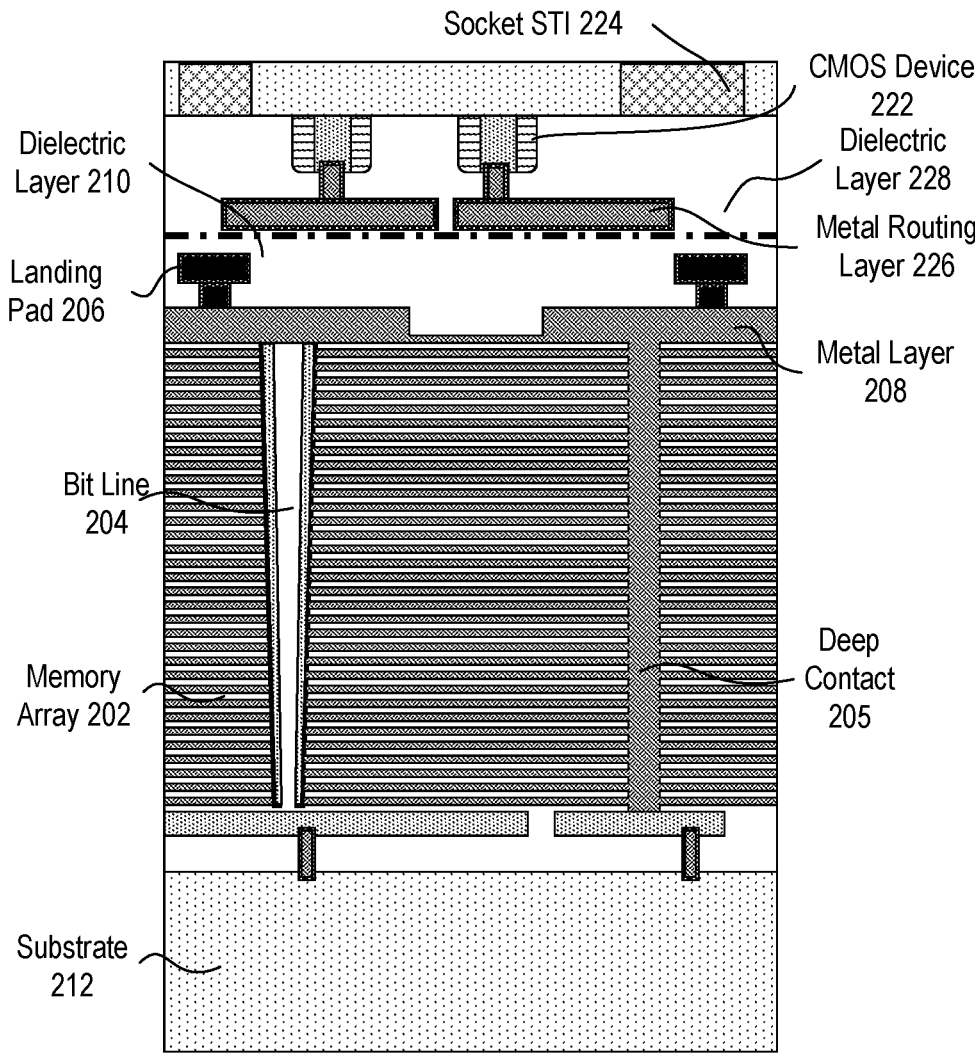

In this example, a memory array wafer 200*a* that is similar to the memory array wafer 100*a* can be provided for the WOW bonding process. For example, as shown in FIG. 2B, the memory array wafer 200*a* may include a substrate 212, a memory array 202 disposed above the substrate 212, a plurality of bit lines 204 and deep contacts 205 vertically extending through the memory array 202, a plurality of metal layers 208 each connecting to corresponding one of the bit lines 204 and deep contacts 205, and a plurality of landing pad 206. The memory array 202 may also include a plurality of word lines (not shown) each connected to corresponding one of the metal layers 208. In this example, each of the plurality of landing pads 206 can be connected to corresponding one of the plurality of metal layers 208 for data and/or control signal transitions. The memory array wafer 200*a* can be encapsulated by a dielectric layer 210, i.e., having the dielectric layer 110 disposed on its frontside surface.

In this embodiment, the CMOS wafer 200*b* can be bonded to the memory array wafer 200*a* to form the WOW bonding shown in FIG. 2B. Here, the frontside surface of the CMOS wafer 200*b* can be bonded to the frontside surface of the memory array wafer 200*a* through the direct bonding technique, e.g., dielectric-dielectric fusion bonding with strong covalent bonds. In this WOW bonding scheme, the dielectric-dielectric bonding can be formed between the dielectric layers 210 and 228 and through applying heat or compressive pressures thereon. Specifically, the dielectric-dielectric bonds formed at the WOW bonding interface can be oxide-oxide covalent bonds. In order to form vertical interconnections between the CMOS devices 222 and corresponding metal layers 208, each of the single level metal routing layers 226 maybe vertically aligned to the corresponding landing pad 206. Further, the CMOS wafer 200*b* can be thinned, after the WOW bonding process and from its backside surface, to expose the plurality of socket STI regions 224.

Figure 2C:
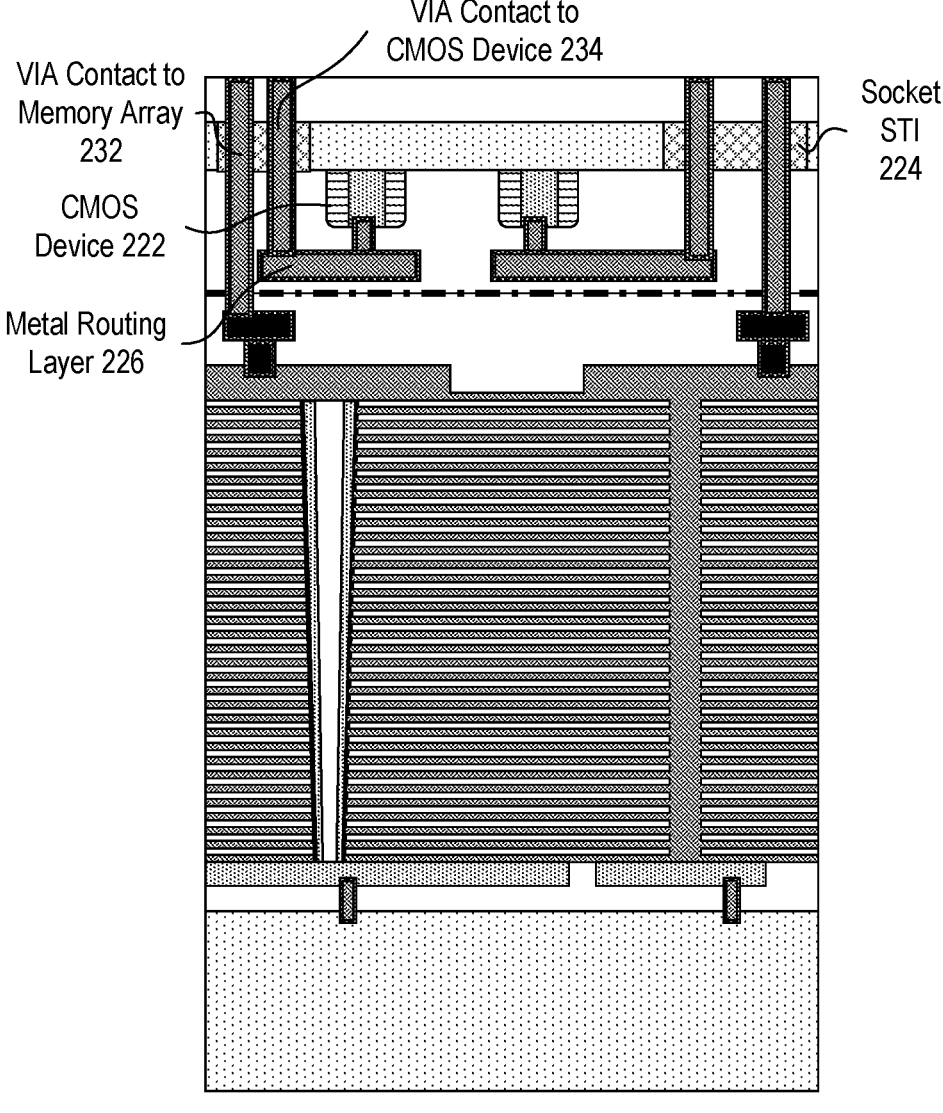

FIG. 2C illustrates vertical interconnections formed between the CMOS devices 222 and the memory array 202 in the WOW packaging. Similar to the WOW bonding described in FIGS. 1E through 1G, two types of via contacts can be formed in this WOW packaging. The first via contact is the via contact to memory array 232 that is disposed in the CMOS wafer 200*b* and further extends into the memory array wafer 200*a*. Specifically, the via contact to memory array 202 passes through corresponding socket STI region 224 and is connected to corresponding landing pad 206. The second via contact is the via contact to CMOS devices 234 which is disposed in the CMOS wafer 100*b* and passes through corresponding socket STI region 124. In this embodiment, the via contact to CMOS devices 134 is only connected to corresponding single level metal routing layer 226. As shown in FIG. 2C, the via contact to memory array 232 and the via contact to CMOS devices 234 are paired for interconnection between each of the CMOS devices 222 and corresponding one of the landing pads 206.

Figure 2D:
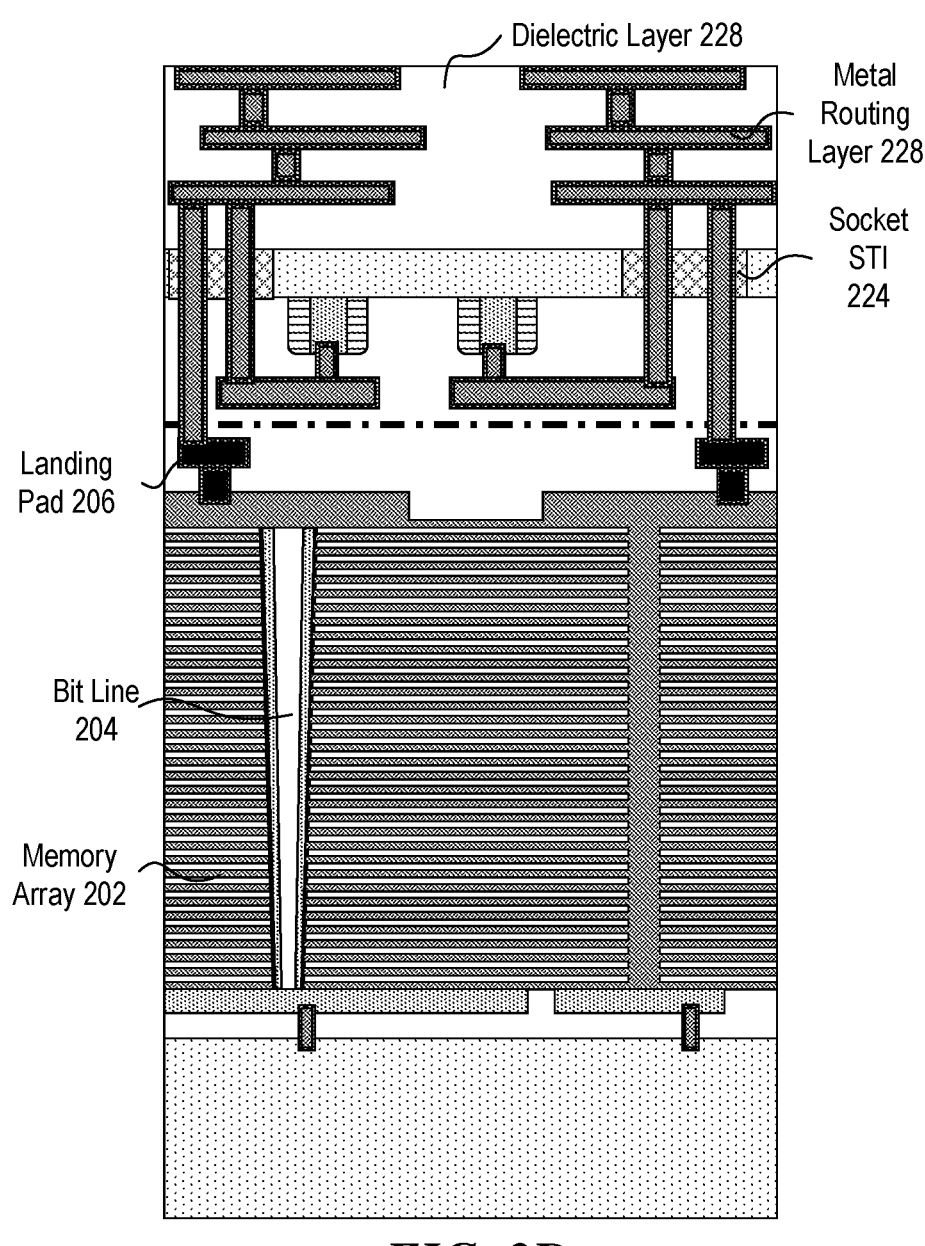

Once the vertical interconnections are formed in the WOW packaging process, additional metal routing layers can be formed in the CMOS wafer. Specifically, multiple levels of metal routing layers 228 can be formed in the backside of the thinned CMOS wafer 200*b*. As shown in FIG. 2D, at least one of the metal routing layers 228 can be connected to the paired corresponding via contact to memory array 232 and via contact to CMOS devices 234. In this embodiment, the multiple levels of metal routing layers 228 and the single level metal routing layer 226 can be made of electrically conductive materials, e.g., tungsten or copper. In addition, the vertical interconnections including the corresponding via contact to memory array 232 and via contact to CMOS devices 234 can be made of conductive materials such as tungsten or other feasible metals/metal alloys.

This WOW bonding scheme described in FIGS. 2A through 2D provides significant flexibility in designing the metal routing layers for routing signals at different levels. Moreover, the single level metal routing layer, e.g., the metal routing layer 226 provided to the WOW bonding and vertical interconnection processes, could simplify the fabrication processes by involving fewer levels of metal routing layers for the F2F WOW packaging.

Figure 3A:
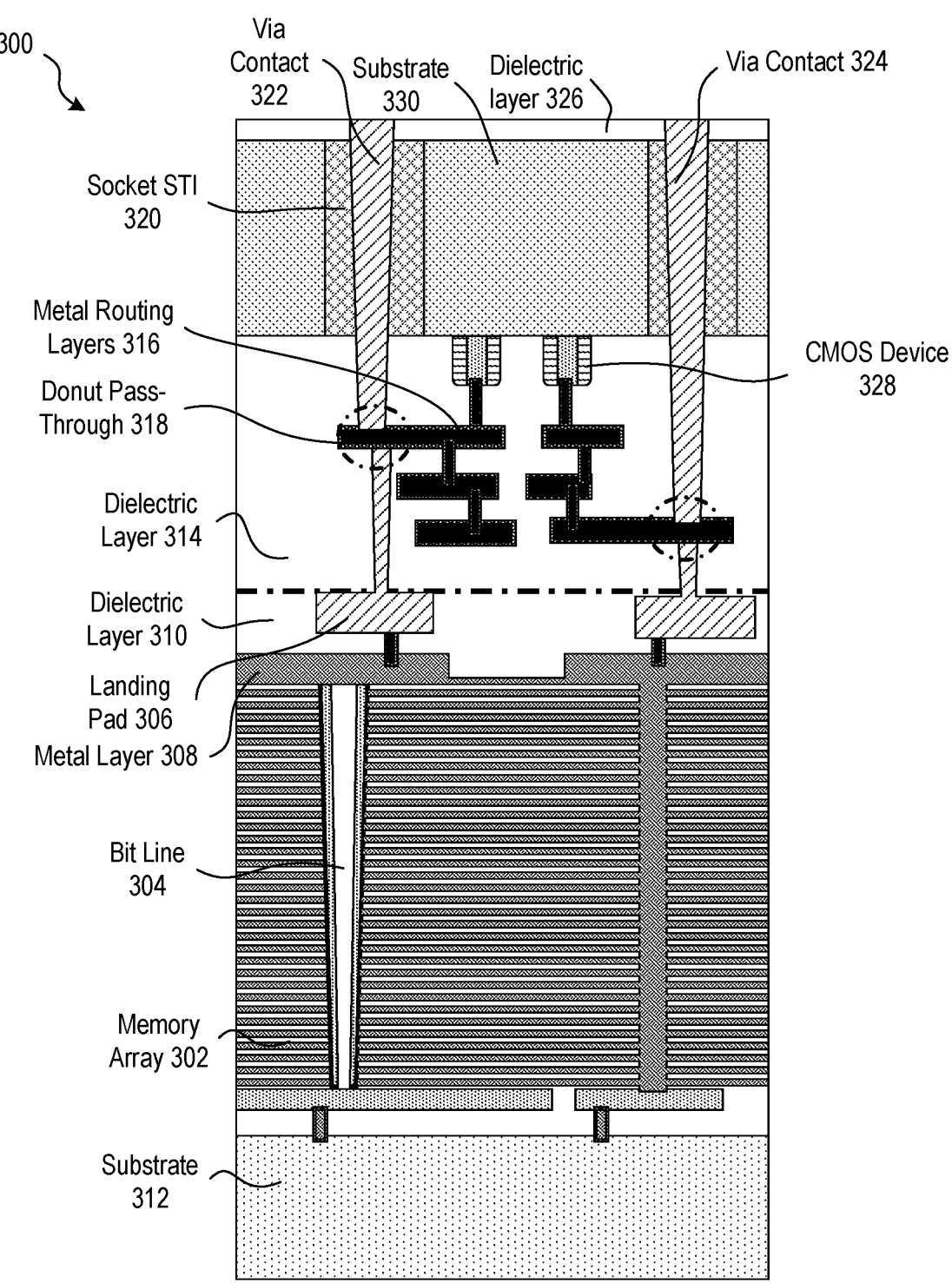
FIG. 3A depicts a schematic view of a WOW packaging in accordance with embodiments of the present technology.
Figures 3B, 3C, 3D, 3E:
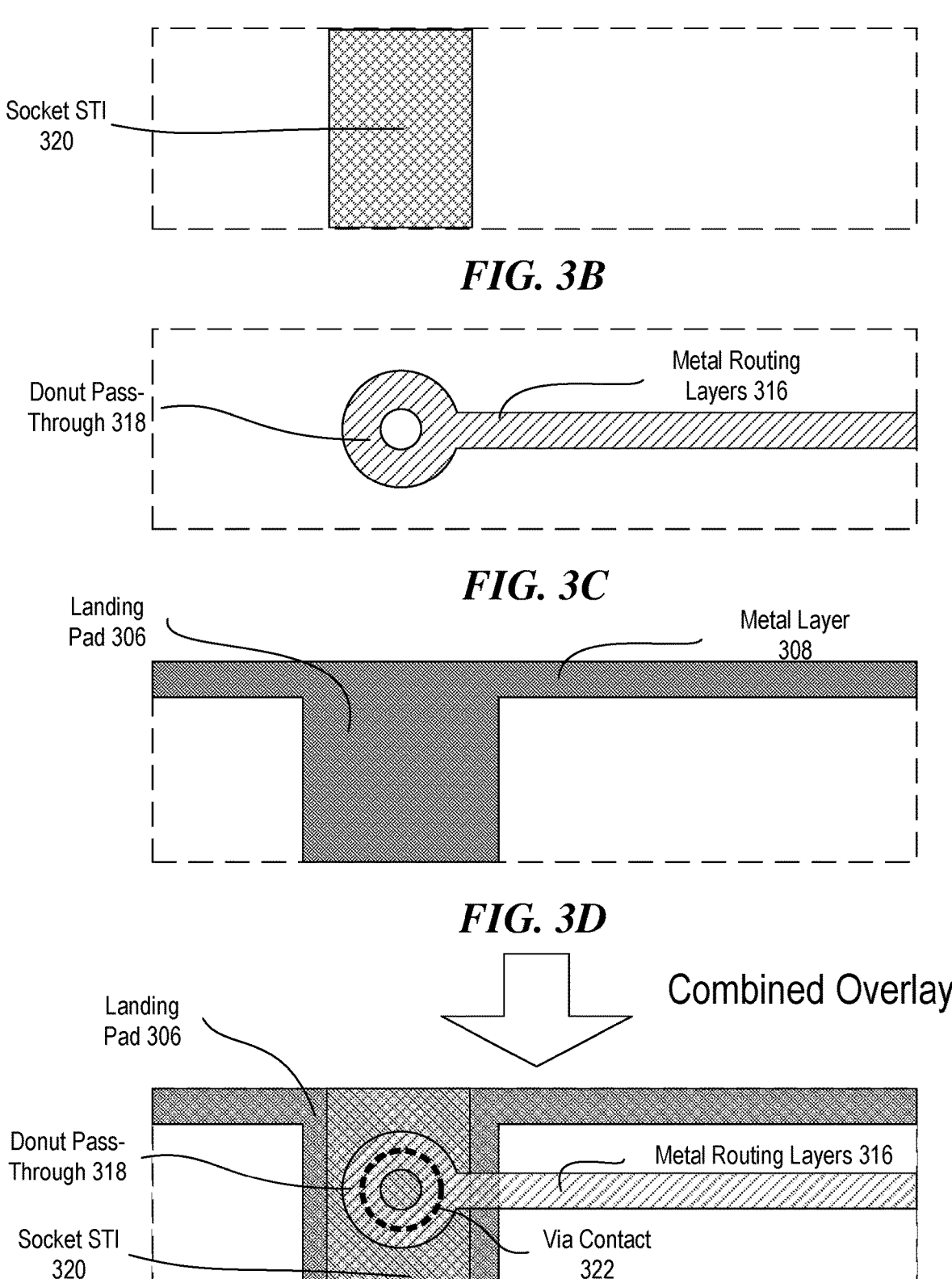
FIG. 3B through 3D illustrate plan views of the WOW packaging of FIG. 3A at various locations from top to bottom according to embodiments of the present technology.
FIG. 3E depicts an overlay top-down view of the WOW packaging by combining FIGS. 3B to 3D in accordance to embodiments of the present technology.

Turning to FIG. 3A which depicts a schematic view of another WOW packaging 300 in accordance with embodiments of the present technology. Accordingly, FIGS. 3B through 3D illustrate plan views of the WOW packaging of FIG. 3A at various locations from top to bottom, e.g., at socket STI region 320, at metal routing layer 316, and at landing pad 306. FIG. 3E depicts a combined overlay top-down view of the WOW packaging profiles illustrated in FIGS. 3B through 3D.

In this embodiment, the WOW packaging 300 includes a memory array wafer 300*a* and a CMOS wafer 300*b*, wherein the CMOS wafer 300*b* is bonded to the memory array wafer 300*a* through the direct bonding technique. Specifically, a frontside surface of the CMOS wafer 300*b* is boned to a frontside surface of the memory array wafer 300*a* through forming dielectric-dielectric fusion bonds therebetween. The direct dielectric-dielectric bonding, e.g., oxide-oxide fusion bonding, can be formed by applying heat and compressive pressure on the bonding interface.

As shown in FIG. 3A, the memory array wafer 300*a* includes a substrate 312, a memory array 302 disposed above the substrate 312, a plurality of bit lines 304 passing through the memory array 302, a plurality of metal layers 308 disposed above the memory array 302 and each being connected to corresponding one of the plurality of bit lines 304. The memory array wafer 300*a* also includes a plurality of landing pads 306 each being connected to corresponding one of the plurality of metal layers 308, and a dielectric layer 310 that encapsulates the memory array wafer 300*a*. On the other hand, the CMOS wafer 300*b* includes a substrate 330, a plurality of socket STI regions 320 disposed in the substrate 330, a plurality of CMOS devices 328 disposed above a frontside surface of the substrate 330, and a plurality of metal routing layers 316 connected to corresponding one of the plurality of CMOS devices 328. The CMOS wafer 300*b* further includes a dielectric layer 314 that is disposed on its frontside surface and that encapsulates the plurality of metal routing layers 316.

In this embodiment, the WOW packaging 300 includes a plurality of via contacts, e.g., the via contact 322 and the via contact 324, each passing through one of the plurality of socket STI 320 and being connected to corresponding one of the plurality of metal routing layer 316 and corresponding one of the plurality of landing pads 306, respectively. Here, a single via contact is fabricated to interconnect one of the CMOS devices 328 to corresponding one of the plurality of landing pads 306 of the memory array wafer 300*a*. Each of the plurality of via contacts 322 and 324 can be processed by forming a via hole in a single etch process and then filling with electrically conductive materials. For example, after the CMOS wafer 300*b* is bonded to the memory array wafer 300*a*, a directional etch process, e.g., a reactive ion etch (RIE) process, can be conducted to etch via holes through the socket STI region 320, the dielectric layer 314, the corresponding metal routing layer 316. The via holes are further etched through the WOW bonding interface and extended into the dielectric layer 310 to interconnect with corresponding landing pads 306 of the memory array wafer 300a. Thereafter, conductive metal materials such as tungsten can be filled into the via holes to form the plurality of via contacts 322 and 324 in the WOW packaging 300.

A unique design of the metal routing layer in the CMOS wafer 300b is provided in this embodiment. For example, the metal routing layer 316 that has the via contact passing through includes a donut pass-through region 318, which has a donut shape metal layer with a hole disposed in its center. In this example, each of the via contacts 322 and 324 are aligned to the donut pass-through region 318 of the metal routing layer 316, having the via contact at least partially aligned to the center hole of the donut pass-through region 318. With this configuration, the via contacts 322 and 324 not only contact to but also pass-through corresponding metal routing layers 316 for the interconnection. Here, the landing pad 306 can be configured to have a large size than the donut pass-through region 318 of the metal routing layer 316, therefore they can be easily aligned vertically in forming the via contacts. As shown in FIG. 3A, the via contact 322 passes through a donut pass-through region 318 of a first level metal routing layer 316, connecting the metal routing layer 316 to the landing pad 306. In this embodiment, the donut pass-through region 318 can be configured on different levels of metal routing layers 316, to meet the design requirement. For example, the donut pass-through region 318 can be disposed on a fifth level metal routing layer shown on the right-hand side of FIG. 3A, providing additional design flexibility. In this example, the via contacts 322 and 324 may have a sloped sidewall caused by the etching process, therefore the via contacts passing through a lower-level metal routing layer may have a larger diameter compared to that passing through a higher-level metal routing layer. As a result, the donut pass-through region 318 can be configured to have a larger diameter on a lower-level metal routing layer than on a high-level metal routing layer, corresponding to the size of via contact passing there through. In some other embodiments, the donut pass-through region 318 can be configured to exist on multiple levels of metal routing layers that connect to a corresponding CMOS device 328. A single via contact, in this example, can pass through multiple donut pass through regions of metal routing layers for signal transition. In some embodiments, the WOW packaging 300 may include additional routing layers at the backside of the CMOS wafer 300b. Those additional routing layers can be connected to corresponding via contacts for signal transition between the CMOS devices 328 and the memory array 302.

FIG. 3B illustrate a plan view of the socket STI region 320 in the bonded CMOS wafer 300b. FIG. 3C illustrates a plan view of the metal routing layer 316 having the donut pass-through region 318 which is disposed at one end of the metal routing layer 316. Alternatively, the donut pass-through region 318 can be disposed on other locations of corresponding metal routing layer 316, e.g., on the middle, or on the other end. FIG. 3D illustrates a plan view of the landing pad 306 and corresponding metal layer 308. As shown, the landing pad 306 has a dimension larger than the diameter of the donut pass-through region 318, making an easier via contact vertical alignment.

FIG. 3E illustrates an overlay plan view of the STI sockets 320, the metal routing layer 316 having the donut pass-through region 318, and the landing pad 306, by combining the FIGS. 3B to 3D. The circular ring represents the via contact 322, which can pass through the middle of the socket STI 320 for a better electrical isolation. Notably, the via contact 322 can have a diameter larger than the inside diameter and smaller than the outer diameter of the donut pass through region 318, to enable a reliable connection to the corresponding metal routing layer 316 while passing there through to connect to the corresponding landing pad 306.

FIG. 4 is a flow chart illustrating a method 400 of processing the WOW packaging for semiconductor device assembly according to embodiments of the present technology. For example, the method 400 includes providing a first wafer having one or more memory arrays and a plurality of landing pads, the one or more memory arrays being connected to the plurality of landing pads respectively, at 402. For example, the memory array wafer 100a can be provided to the WOW bonding process. The memory array wafer 100a includes the memory array 102 and the plurality of landing pads 106, as shown in FIG. 1A.

The method 400 also includes providing a second wafer including CMOS devices, a plurality of socket shallow trench isolation (STI) regions disposed in a substrate of the second wafer, and a plurality of metal routing layers connected to corresponding CMOS devices, at 404. For example, the CMOS wafer 100b can be provided for the WOW bonding process. As shown in FIG. 1B, the CMOS wafer 100b includes the substrate 130, the plurality of socket STI regions 124 disposed in the substrate 130, and the plurality of CMOS devices 122.

In addition, the method 400 includes bonding a frontside surface of the first wafer to a frontside surface of the second wafer to form a wafer-on-wafer (WOW) bonding, at 406. For example, the CMOS wafer 100b can be bonded to the memory array wafer 100a. As shown in FIG. 1C, the frontside surface of the CMOS wafer 100b can be bonded to the front side surface of the memory array wafer 100a. Specifically, the dielectric layers 128 and 110 are bonded by the direct bonding technique including applying heat and compressive pressure at the WOW bonding interface.

Further, the method 400 includes thinning the second wafer from its backside surface, at 408. For example, once the CMOS wafer 100b is bonded to the memory array wafer 100a, its backside surface can be thinned by a suitable technique such as wafer back grinding to remove the bulk of excess substrate/wafer thickness, as shown in FIG. 1D.

In addition, the method 400 includes etching a plurality of a first type of via holes and a plurality of a second type of via holes from the backside surface of the second wafer, each of the plurality of the first type of via holes being etched to a corresponding one of the plurality of metal routing layers, and each of the plurality of the second type of via holes being etched to a corresponding one of the plurality of landing pads, at 410. For example, via holes can be formed in the WOW packaging included the bonded CMOS wafer 100b and the memory array wafer 100a. As shown in FIG. 1E, via holes can be etched through corresponding socket STI regions 124 and the WOW bonding interface, and further extends to corresponding landing pad 106 of the memory array wafer 100a. The via holes can also be etched through corresponding socket STI regions 124 to corresponding metal routing layer 126. Those two types of via holes can be paired to etch through a same socket STI region or different socket STI regions.

Further, the method 400 includes filling a conductive material into the plurality of the first type of via holes and the plurality of the second type of via holes to form a plurality of a first type of via contacts and a plurality of a second type of via contacts, respectively, at 412. For example, conductive materials such as tungsten can be filled in the via holes to form the via contract to memory array 132 and the via contact to CMOS device 134, respectively.

Lastly, the method 400 includes forming a plurality of routing layers each being connected to one of the plurality of the first type of via contacts and a corresponding one of the plurality of the second type of via contacts, at 414. For example, the plurality of routing layers 136 can be formed at the backside surface of the CMOS wafer 100*b*. As shown in FIG. 1F, each of the plurality of routing layers 136 is connected to a pair of via contract to memory array 132 and via contact to CMOS device 134, to complete the signal transition path from the CMOS device 122 to the memory array 102.

Figure 5:
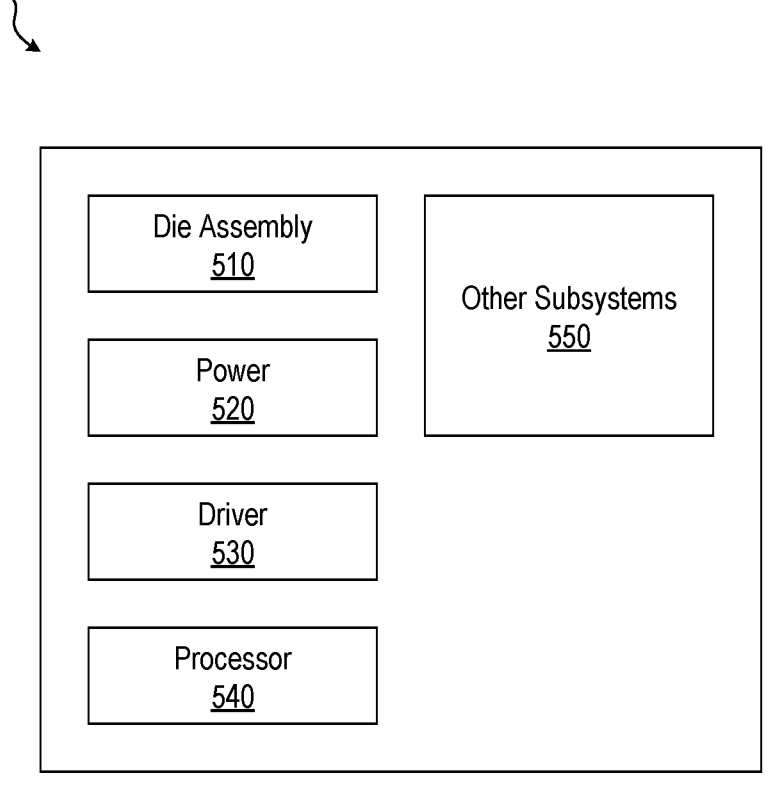
FIG. 5 is a schematic view of a system that includes a semiconductor device configured according to embodiments of the presented technology.

Any one of the semiconductor structures described above with reference to FIGS. 1A-3E can be incorporated into any of a myriad of larger and/or more complex systems, a representative example of which is system 500 shown schematically in FIG. 5. The system 500 can include a semiconductor device 510, a power source 520, a driver 530, a processor 540, and/or other subsystems or components 550. The semiconductor device 510 can include features generally similar to those of the semiconductor devices described above and can therefore include the WOW bonding and vertical via interconnections described in the present technology. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random-access memory (DRAM) dice, NOT-AND (NAND) memory dice, NOT-OR (NOR) memory dice, magnetic random access memory (MRAM) dice, phase change memory (PCM) dice, ferroelectric random access memory (Fe RAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a first module having one or more memory arrays, each of the one or more memory arrays being connected to a plurality of landing pads of the first module; and
a second module having complementary metal-oxide-semiconductor (CMOS) devices, the second module comprising:
  a plurality of socket shallow trench isolation (STI) regions disposed in a substrate of the second module,
  a plurality of metal routing layers connected to corresponding CMOS devices,
  a plurality of a first type of via contacts each being connected to a corresponding one of the plurality of metal routing layers, and
  a plurality of a second type of via contacts each being connected to a corresponding one of the plurality of landing pads of the first module, wherein the plurality of the first type of via contacts and the plurality of the second via contacts pass through the plurality of socket STI regions,
wherein a frontside surface of the first module and a frontside surface of the second module are bonded to form a wafer-on-wafer (WOW) bonding.

2. The semiconductor device assembly of claim 1, wherein the first module further comprises a first dielectric layer disposed on the frontside surface of first module, wherein the second module further comprises a second dielectric layer disposed on the frontside surface of the second module, and wherein the WOW bonding is formed through a dielectric-dielectric fusion bonding between the first and the second dielectric layers.

3. The semiconductor device assembly of claim 1, wherein the plurality of the second type of via contacts further extend through the WOW bonding interface and into the first module to connect to the plurality of landing pads, respectively.

4. The semiconductor device assembly of claim 1, wherein each of the first type of via contacts is disposed within the second module and is connected to a lower-level metal routing layer of the plurality of metal routing layers or a higher-level metal routing layer of the plurality of metal routing layers.

5. The semiconductor device assembly of claim 1, wherein each of the plurality of the first type of via contacts and a corresponding one of the plurality of the second type of via contacts pass through a corresponding one of the plurality of socket STI regions.

6. The semiconductor device assembly of claim 5, wherein each of the first type of via contacts and corresponding one of the second type of via contacts that pass through the corresponding one of the plurality of socket STI regions are isolated within the corresponding one of the plurality of socket STI regions.

7. The semiconductor device assembly of claim 1, wherein the plurality of the first type of via contacts and the plurality of the second type of via contacts each passes through a dedicated corresponding one of the plurality of socket STI regions.

8. The semiconductor device assembly of claim 1, wherein each of the first type of via contacts and corresponding one of the second type of via contacts are connected to a corresponding one of a plurality of routing layers of the second module.

9. The semiconductor device assembly of claim 8, wherein the plurality of routing layers are disposed below the substrate and are close to a backside surface of the second module.

10. The semiconductor device assembly of claim 9, wherein the second module further comprises a plurality of bond pads disposed on the backside surface of the second module, each of the plurality of bond pads being connected to a corresponding one of the plurality of routing layers.

11. The semiconductor device assembly of claim 1, wherein each of the first type of via contacts and corresponding one of the second type of via contacts are connected to a corresponding one of the plurality of routing layers that are disposed below the substrate and are close to a backside surface of the second module.

12. A semiconductor device assembly, comprising:
a first module having one or more memory arrays, each of the one or more memory arrays being connected to a plurality of landing pads of the first module; and
a second module having complementary metal-oxide-semiconductor (CMOS) devices, the second module comprising:
  a plurality of socket shallow trench isolation (STI) regions disposed in a substrate of the second module,
  a plurality of metal routing layers connected to corresponding CMOS devices, and
  a plurality of via contacts each being connected to a corresponding one of the plurality of metal routing layers of the second module and a corresponding one of the plurality of landing pads of the first module; wherein each of the plurality of the via contacts passes through a corresponding one of the plurality of socket STI regions,
wherein a frontside surface of the first module and a frontside surface of the second module are bonded to form a wafer-on-wafer (WOW) bonding.

13. The semiconductor device assembly of claim 12, wherein the first module further comprises a first dielectric layer disposed on the frontside surface of first module, wherein the second module further comprises a second dielectric layer disposed on the frontside surface of the second module, and wherein the WOW bonding is formed through a dielectric-dielectric fusion bonding between the first and the second dielectric layers.

14. The semiconductor device assembly of claim 12, wherein the corresponding one of the plurality of metal routing layers includes a donut profile with an inner hole, and wherein the each of the plurality of via contacts passes through the donut profile inner hole of the corresponding one of the plurality of metal routing layers.

15. The semiconductor device assembly of claim 14, wherein the donut profile of corresponding each of the plurality of metal routing layers is vertically aligned to the corresponding one of the plurality of landing pads of the first module.

16. The semiconductor device assembly of claim 14, wherein at least one of the plurality of via contacts is connected to corresponding more than one metal routing layers of the plurality of metal routing layers, wherein the more than one metal routing layers each includes the donut profile with the inner hole, and wherein the at least one of the plurality of via contacts passes through the donut profiles of the corresponding more than one metal routing layers.

17. A method of forming a semiconductor device assembly, comprising:

providing a first wafer having one or more memory arrays and a plurality of landing pads, the one or more memory arrays being connected to the plurality of landing pads respectively;

providing a second wafer including complementary metal-oxide-semiconductor (CMOS) devices, a plurality of socket shallow trench isolation (STI) regions disposed in a substrate of the second wafer, and a plurality of metal routing layers connected to corresponding CMOS devices;

bonding a frontside surface of the first wafer to a frontside surface of the second wafer to form a wafer-on-wafer (WOW) bonding;

thinning the second wafer from its backside surface;

etching a plurality of a first type of via holes and a plurality of a second type of via holes from the backside surface of the second wafer, each of the plurality of the first type of via holes being etched to a corresponding one of the plurality of metal routing layers, and each of the plurality of the second type of via holes being etched to a corresponding one of the plurality of landing pads;

filling a conductive material into the plurality of the first type of via holes and the plurality of the second type of via holes to form a plurality of a first type of via contacts and a plurality of a second type of via contacts, respectively; and forming a plurality of routing layers each being connected to one of the plurality of the first type of via contacts and a corresponding one of the plurality of the second type of via contacts.

18. The method of forming the semiconductor device assembly of claim 17, further comprising forming a plurality of bond pads on the backside surface of the second wafer, each of the plurality of bond pads being connected to a corresponding one of the plurality of routing layers.

19. The method of forming the semiconductor device assembly of claim 17, wherein bonding the first and second wafers includes forming a dielectric-dielectric fusion bonding between a first dielectric layer of the first wafer and a second dielectric layer of the second wafer, the first dielectric layer being disposed on the frontside surface of the first wafer and the second dielectric layer being disposed on the frontside surface of the second wafer.

20. The method of forming the semiconductor device assembly of claim 17, wherein etching the plurality of the first and the second type of via holes includes etching each of the plurality of the first type of via holes and a corresponding one of the plurality of the second type of via holes through a corresponding one of the plurality of socket STI regions.

* * * * *